United States Patent [19]

Forchert et al.

[11] Patent Number: 5,327,343
[45] Date of Patent: Jul. 5, 1994

[54] UNIVERSALLY AND BIDIRECTIONALLY OPERABLE DEVICE FOR SIGNAL PATH CONTROL IN A MOTOR VEHICLE DIAGNOSTIC SYSTEM

[75] Inventors: Thomas Forchert, Stuttgart; Konstantin Müller, Deizisau, both of Fed. Rep. of Germany

[73] Assignee: Daimler-Benz AG, Fed. Rep. of Germany

[21] Appl. No.: 753,991

[22] Filed: Sep. 3, 1991

[30] Foreign Application Priority Data

Sep. 1, 1990 [DE] Fed. Rep. of Germany ....... 4027824

[51] Int. Cl.$^5$ .......................... G06F 7/70; G06G 7/76
[52] U.S. Cl. .......................... 364/424.01; 364/424.03; 364/531.01; 395/800; 370/85.2; 370/84
[58] Field of Search ...................... 364/424.01, 424.02, 364/424.03, 551.01, 557, 550, 554, 505, 575; 370/85.2, 85.6, 55, 13, 84, 112, 10, 15, 16; 395/800

[56] References Cited

U.S. PATENT DOCUMENTS

| | | | |
|---|---|---|---|
| 3,994,269 | 11/1976 | Takaoka et al. | 123/117 A |
| 4,542,335 | 9/1985 | Williams | 324/66 |
| 4,839,811 | 6/1989 | Kanegae et al. | 364/424.03 |
| 4,853,850 | 8/1989 | Krass, Jr. et al. | 364/200 |
| 4,906,970 | 3/1990 | Momura | 340/459 |
| 4,926,330 | 5/1990 | Abe et al. | 364/431.01 |
| 5,003,476 | 3/1991 | Abe | 364/424.04 |
| 5,077,670 | 12/1991 | Takai et al. | 371/70 |
| 5,214,582 | 5/1993 | Gray | 364/424.03 |

FOREIGN PATENT DOCUMENTS

| | | |
|---|---|---|
| 1148763 | 5/1963 | Fed. Rep. of Germany. |
| 2504102 | 11/1976 | Fed. Rep. of Germany. |
| 3333333 | 3/1985 | Fed. Rep. of Germany. |
| 3731836 | 9/1986 | Fed. Rep. of Germany. |
| 2135064 | 8/1984 | United Kingdom. |

*Primary Examiner*—Thomas G. Black
*Assistant Examiner*—Jacques Harold Louis-Jacques
*Attorney, Agent, or Firm*—Evenson, McKeown, Edwards & Lenahan

[57] ABSTRACT

A device for signal path control in a motor vehicle permits the reception or the transmission of signals from or to a multiplicity of electronic units via a cable with a small number of line conductors. The device is universally applicable and is suitable for both on-board and off-board applications. Its robustness makes it suitable also for diagnostic systems in motor vehicles.

11 Claims, 2 Drawing Sheets

UNIVERSALLY AND BIDIRECTIONALLY OPERABLE DEVICE FOR SIGNAL PATH CONTROL IN A MOTOR VEHICLE DIAGNOSTIC SYSTEM

CROSS REFERENCE TO RELATED APPLICATION

This application relates to an application entitled "DIAGNOSTIC DATA ACQUISITION FOR MOTOR VEHICLE ELECTRONIC UNITS" filed on Sep. 3, 1993 in the names of Thomas Forchert and Ulrich Vesel. This application has been accorded Ser. No. 07/753,998.

BACKGROUND AND SUMMARY OF THE INVENTION

The present invention relates to a device for signal path control for use in a motor vehicle and, more particularly, to a device which can be operated universally and bidirectionally with respect to signal paths and which permits a freely selectable change of input and output path assignments.

DE-A1-37 31 836 discloses an error diagnosis system for electronic units of a motor vehicle designed to receive error signals from electronic units and to display them. In this system, a vehicle contains at least one electronic unit, and preferably a plurality of electronic units, having self-diagnostic functions. Diagnostic outputs of the individual electronic units are connected to a plug-in connection to which a diagnostic tester can be connected. The data transmission from the plug-in connection to the diagnostic tester is made via lines connected in parallel. From each electronic unit capable of self-diagnosis, there is therefore a line connected via the plug-in connection to the diagnostic tester. In this known system, a undirectional data transmission is essentially provided.

If a large number of electronic units are to be monitored in a system as described in DE-A1-37 31 836 and a diagnosis device cannot be arranged near to the plug-in connection because, for example, it is to be served and read outside the vehicle, a multichannel connection from a vehicle interface to the diagnostic tester proves disadvantageous, for several reasons. When mechanically loaded, a correspondingly multiconductor cable tends to experience line breaks. In addition, cross-talk interference between different channels can occur. As a result, the advantages of such a device are greatly reduced.

DE-OS 33 33 333 discloses a method and a device for signal transmission in motor vehicle diagnostic devices. Measurement cables are fed to a peripheral which is protected against interference radiation. After amplification of the corresponding signals, they are preferably passed on to the diagnostic devices on a single optical path. No influencing of the signal assignment which can be controlled by at least one diagnosis device in a freely selectable way is provided.

DE-AS 11 48 763 discloses a compensation plotter for recording a multiplicity of measurement variable in which one of a multiplicity of measurement signals can be fed to the plotting amplifier of the compensation plotter via a two-stage arrangement of group switches. For this purpose, the corresponding switches are mechanically actuated at the input in accordance with the measurement value which is to be plotted at that moment.

DE-AS 25 04 102 discloses an arrangement for time-division-multiplex transmission of parallel analog measurement values and digital reports. This arrangement is suitable for a cyclical design of a serial data from corresponding to a multiplicity of signals present in each case in parallel. At the same time, individual groups of input lines are connected as appropriate, one after the other, to a parallel-serial converter by an executive sequencing control.

An object of the present invention is to provide a universal device for signal path control for use in a motor vehicle. The device of the present invention can be operated universally and bidirectionally with respect to signal paths and permits, in the course of the signal flow, a freely selectable change of the assignment of input to output path.

This object has been achieved in a device according to the present invention for signal path control having multi-gang switching components which are individually electrically driveable for switch actuation via p inputs, and single-gang switching components are individually electrically driveable via q further inputs. The device is assigned a drive circuit which comprises a shift register serially loadable via a loading input and having a transfer control input and an at least $p+1$ bit-wide parallel output; a bank of $(p+q)$ latches having a common transfer input, in which bank the contents of $(p+q)$ storage cells of the shift register can be loaded when the transfer input of the parallel output of the shift register is driven, and a logic unit connected upstream which is connected on the input side to a selection control line and to a transfer control line and whose output is connected to the transfer control input of the shift register, to the loading input of the shift register and to the transfer input of the bank of latches. The outputs of the latches are operatively connected to corresponding control terminals of the multi-gang switching components and single-gang switching components.

The device according to the invention for signal path control functions as a device for connecting a multiplicity of lines with serially provided signals to a single line, for example of a data cable, or vice versa.

In an advantageous manner, the selection of the signal path occurs by way of a serial path signal which is converted into a parallel drive bit pattern which corresponds to the desired signal path. A multiplicity of storage cells matched to the bit length of the serial signal permits the stationary signal path to be maintained until the signal path is correspondingly changed by the reception of a new serial path signal. In this manner, a cable with a minimum number of conductors is required between a data entry interface or data distribution interface and a data-receiving or data-transmitting system. At the same time, a high degree of interference signal suppression between different data channels is achieved.

Further advantages are provided by the present invention: For example, the device can accordingly be used both in a vehicle and also outside a vehicle. It is also particularly suitable as a component of an off-board diagnosis system.

BRIEF DESCRIPTION OF THE DRAWINGS

These and further objects, features and advantages of the present invention will become more apparent from FIG. 1 is a block circuit diagram of the signal path control device with parallel drive in accordance with the present invention.

DETAILED DESCRIPTION OF THE DRAWINGS

Figure 1:
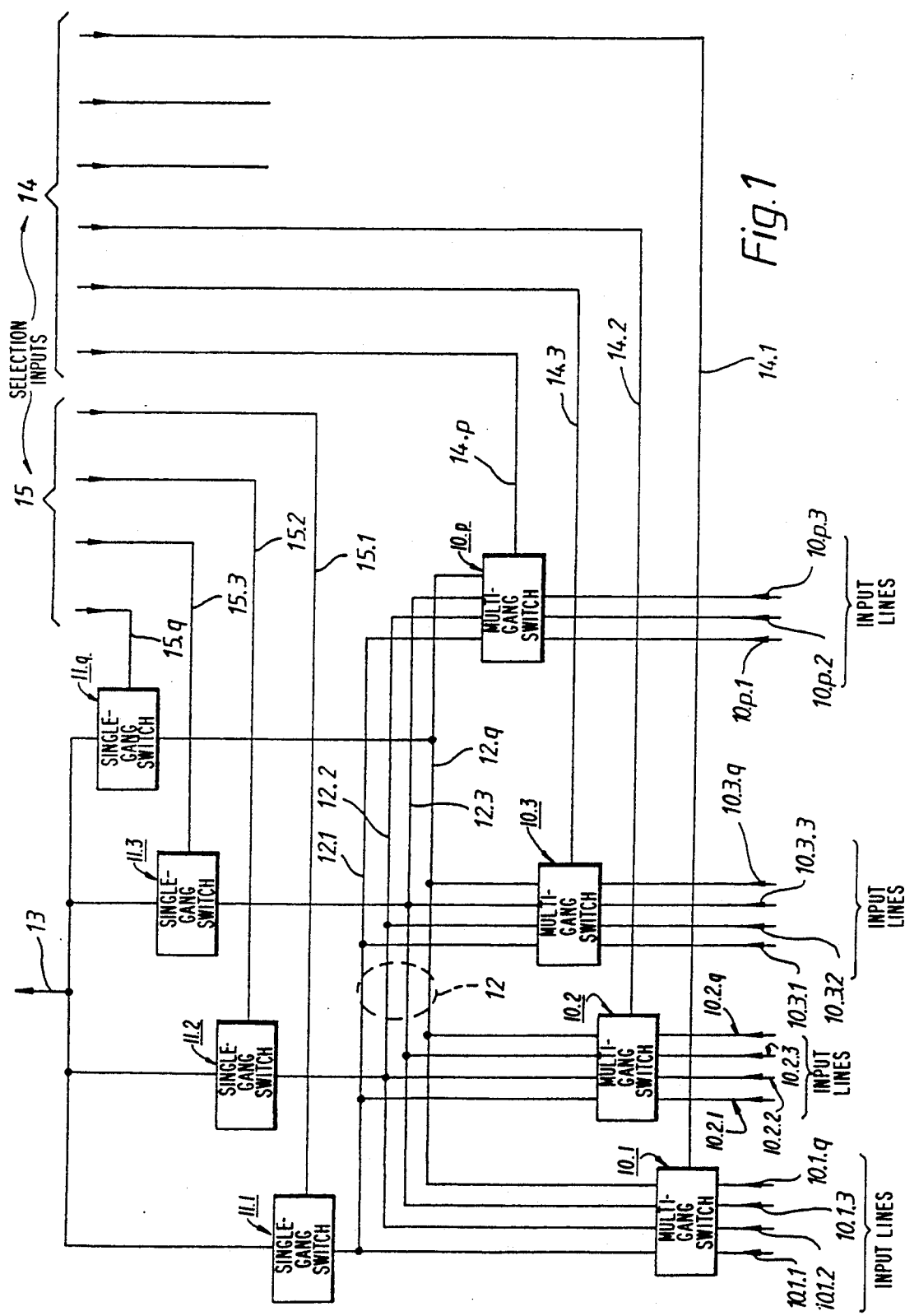

According to FIG. 1, the device comprises driveable single-gang switching components 11.1 to 11.$q$ and multi-gang switching components 10.1 to 10.$p$ having bidirectionally operable switching sections which in each case are respectively assigned to a selection input 15.1 to 15.$q$ and 14.1 to 14.$p$ and are electrically driveable. These can be relays with single or multiple contacts or corresponding analog switches of the integrated semiconductor circuit type.

In the illustrated embodiment, the multi-gang switching components 10.1 to 10.$p$ each have four switching sections which are isolated from one another. Switching components with any other number of poles are, however, equally utilized. For example, 8-pole CMOS analog switches are usable. The input lines 10.1.1 to, for example, switching component, 10.$p$.3 originating from signal sources can, for example, be connected to a total of thirty-five (35) switching section inputs of nine multi-gang switching components 10.1 to 10.9, each of four-pole construction. The corresponding switching section outputs are connected in parallel in the same order, i.e. combined to form a line-linking bundle or node 12, the width q of which corresponds to the number of poles of the multi-gang switching components 10.1 to 10.$p$ on the input side. The multi-gang switch components 10.1 to 10.$p$ can, to this extent, be individually driven by a first selection line bundle 14 which is p lines wide. The individual line links 12.1 to 12.$q$ are connected to the switching section inputs of the single-gang switching components 11.1 to 11.$q$ which can be individually driven by a second selection line bundle 15 which is q lines wide.

By way of 1-out-of-p drive of the multi-gang switching components 10.1 to 10.$p$ of the device of FIG. 1, in each case a number of signal inputs corresponding to the number of poles q of the multi-gang switching components 10.1 to 10.$p$ is connected to the line-linking bundle or node 12. Likewise, by way of 1-out-of-q drive of the single-gang switching components 11.1 to 11.$q$, in a corresponding manner, in each case one of the q line links 12.1 to 12.$q$ is connected to the output 13 which combines the switching section outputs of the switches 11.1 to 11.$q$.

When there are n signal inputs, with a standard pole width q of the multi-gang switching components, only the rounded-up integer of (n/q)+q selection lines 14 and 15 are therefore required, in the exemplary case n=35, q=4. Therefore, only thirteen (13) selection lines are required.

Depending on the condition of the switching components, they may possibly by driven directly by a microcomputer according to the "1 out of (p,q)" mode. Together with a ground line (not shown) which is common for input and output and with the signal line 13, a corresponding device thus requires fifteen (15) line conductors to select and take over thirty five (35) available signal paths or to transfer a signal to one of thirty five (35) available signal paths.

Figure 2:
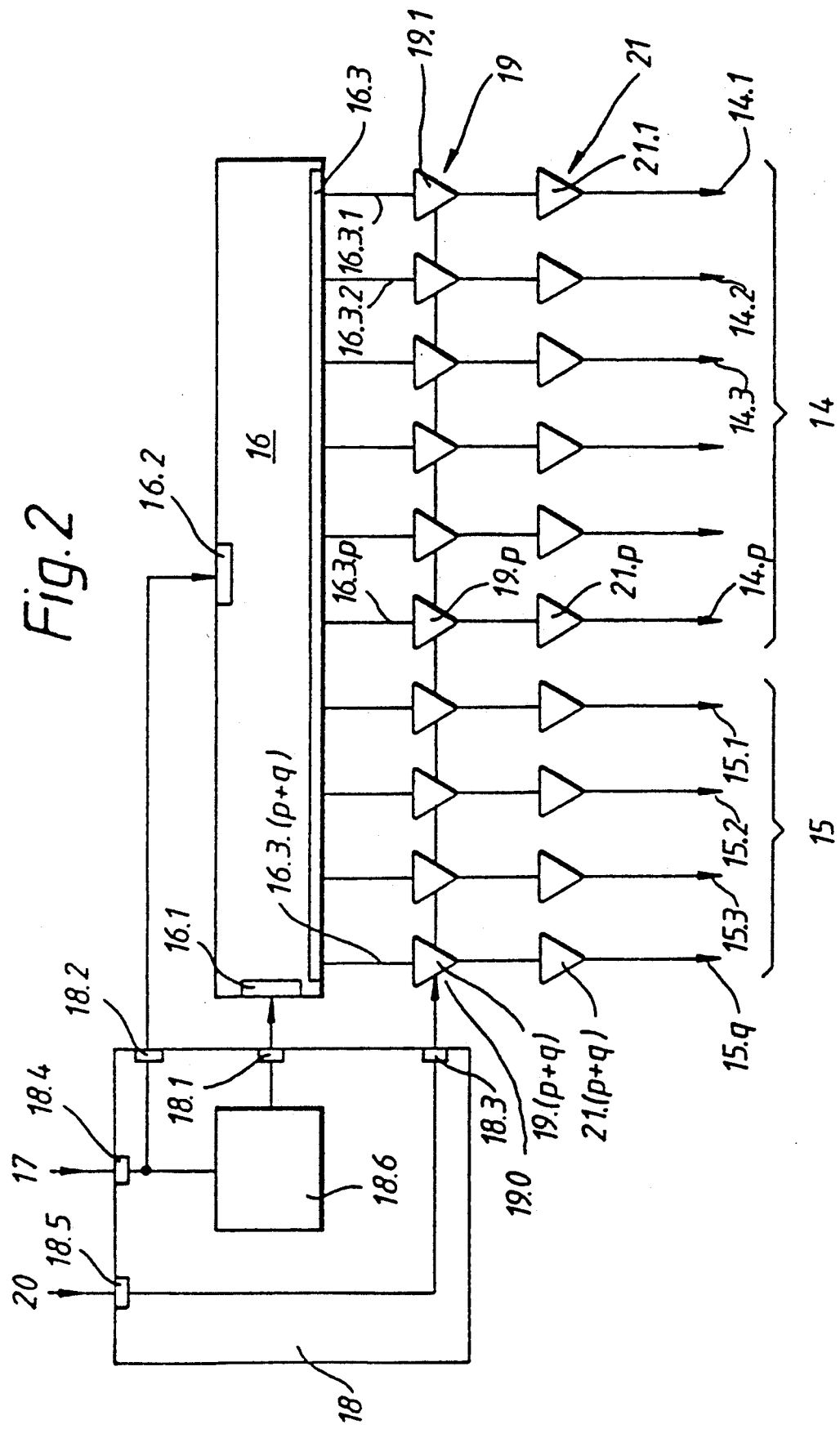
FIG. 2 is a block circuit diagram of an extension component of the signal path control device for serial drive.

The extension component according to FIG. 2 permits under the same conditions a reduction of the number of line conductors (including ground line) to only four.

The extension comprises for this purpose a serially loadable shift register 16, a logic unit 18, a bank 19 of latches 19.1 to 19.(p+q) and, optionally, a further bank 21 of line drivers 21.1 to 21.(p+q). A serial selection control line 17 and a transfer control line 20 are connected to the logic unit 18. The logic unit 18 generates the output signal 18.2 for the loading input 16.2, the output signal 18.1 of the transfer control input 16.1 of the shift register 16 and the output signal 18.3 for the transfer input 19.0 of the latches 19. The shift register 16 has a parallel output 16.3. Each individual output 16.3.1 to 16.3.(p+q) has connected downstream thereof of a latch 19.1 to 19.(p+q) and each of these, optionally, has a driver 21.1 to 21.(p+q) connected downstream. The first p outputs of the latches or line drivers feed the selection lines 14, the remaining q outputs of the latches or line drivers feed the selection lines 15. The latches 19.1 to 19.(p+q) can be activated via a common transfer control line 20.

The selection control line 17 and the transfer control line 20, the signal output line 13 according to FIG. 1 and a ground conductor (not shown) are, for example, components of only one four-pole remote control cable. Drivers 21.1 to 21.(p+q) can then be dispensed with if the latches 19.1 to 19.(p+q) have sufficient output loading capacity for the direct driving of the switching components 10.1 to 11.$q$ according to FIG. 1, for example, when the switching components are implemented as semiconductor switches.

In the embodiment of the logic unit 18 of FIG. 2, a monostable flip-flop 18.6 is used. For example, serial synchronous driving to a counter component is conceivable as a further exemplary embodiment of the logic unit 18. By way of the selection control line 17, a serial RTZ bit specimen is applied to the input 18.4 of the logic unit and the monostable flip-flop 18.6 and via the output 18.2 to the loading input 16.2 of the shift register 16. By way of the return edge of the monostable flip-flop at the transfer control input 16.1, the momentary bit signal level at the loading input 16.2 is transferred into the shift register and the register contents are shifted by one bit.

During the above-described process, the drive bit specimen of the selection entered directly before which is assigned to the control outputs 14 and 15 remains stored in the latches 19.1 to 19.(p+q). If the register contents were moved by (p+q) places, the new data word which can be read out at all the outputs 16.3 corresponds to the new "selection word" to be tapped off at the selection lines 14 and 15. By receiving a latch activation signal on the transfer control line 20, which was looped through (18.5, 18.3) in the logic unit 18, this data word is then written into the latch bank 19 and is thus available for driving the device component according to FIG. 1 at outputs 14 and 15 until it is overwritten by a different data word from the output 17.3 by renewed latch activation. The corresponding transfer signal is generally transmitted by a signal-emitting or a signal-interrogating device.

The signal path control device according to the present invention is suitable both for permanent installation in a motor vehicle and also for equipping an external device, for example a diagnosis device which is to be connected only temporarily to a motor vehicle. It permits relatively thin signalling cables with only a few conductors to be used, which conductors can thus be of robust design and can be easily laid in protected form even under spatially restricted conditions.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A device for signal path control in a motor vehicle, whereby a signal path is connectable to one of n signal paths and to a specific signal path of a multiplicity n of signal paths, comprising
   (a) rounded-up integer of p{(n/q)} q-poled multi-gang switching components operatively connected to be individually electrically driveable for switch actuation via p inputs,
   (b) q single-gang switching components,
   (c) switching section inputs of said multi-gangs switching components being connectable to the n signal paths and switching section outputs thereof being connected in parallel in the same order to q nodes,
   (d) switching section inputs of said single-gang switching components being each connected to one of said q nodes and the switching section outputs thereof being connected to a signal line which is one of a common incoming line and a common outgoing line, and the single-gang switching components being operatively connected to be individually electrically driveable via q further inputs, and
   (e) an assigned drive circuit comprising
      (1) a shift register serially inputable via a loading input and having a transfer control input and an at least p+q bit-wide parallel output;
      (2) a bank of latches having a common transfer input, in which bank the contents of storage cells of the shift register can be loaded when the transfer input of said parallel output of the shift register is driven, and
      (3) a logic unit connected upstream which is connected on the input side to a selection control line and to a transfer control line and whose output is connected to the transfer control input of the shift register, the loading input of the latter and to the transfer input of the bank of latches, whereby the outputs of said latches are operatively connected to corresponding control terminals of the multi-gang switching components and single-gang switching components.

2. The device according to claim 1, wherein the bank of latches has connected downstream thereof a bank of drivers for directly driving said switching components.

3. The device according to claim 1, wherein the device is fixed to the vehicle.

4. The device according to claim 1, wherein the device is provided in a vehicle in operative connection with an interface for transmitting a parallel multiplicity of individual signals.

5. The device according to claim 1, wherein the device is in operative connection with an interface for transmitting a parallel multiplicity of signals between a motor vehicle and an external device.

6. The device according to claim 1, wherein the device is in operative connection with an interface for transmitting a parallel multiplicity of signals between a motor vehicle and a diagnostic device.

7. The device according to claim 6, wherein the device is mounted inside a plug-on connection module which can be plugged either onto or into the motor vehicle.

8. The device according to claim 1, wherein the switching components are relays.

9. The device according to claim 1, wherein the switching components are integrated semiconductor analog switches.

10. The device according to claim 1, wherein signal selection and signal transmission occurs via only three lines and a vehicle ground line configured as common return line.

11. The device according to claim 9, wherein a further line, together with the vehicle ground line, provide the operating voltage supply of the switching components.

* * * * *